March 19, 1957 S. POGANSKI 2,786,166

ELECTRIC UN-SYMMETRICALLY CONDUCTIVE SYSTEMS, PARTICULARLY DRY-PLATE RECTIFIERS

Filed May 23, 1955

Inventor

SIEGFRIED POGANSKI

BY Toulmin & Toulmin

ATTORNEYS.

United States Patent Office 2,786,166

Patented Mar. 19, 1957

2,786,166

ELECTRIC UNSYMMETRICALLY CONDUCTIVE SYSTEMS, PARTICULARLY DRY-PLATE RECTIFIERS

Siegfried Poganski, Belecke-Moehne, Germany, assignor to Licentia Patent-Verwaltungs-G. m. b. H., Hamburg, Germany Application May 23, 1955, Serial No. 510,393

Claims priority, application Germany October 1, 1948

6 Claims. (Cl. 317—234)

Figure 1:
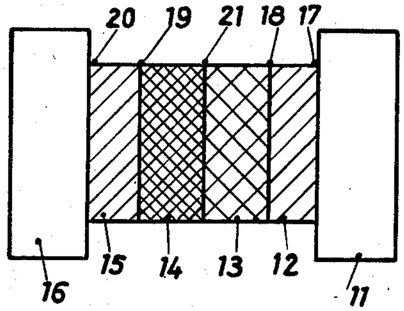

The present invention relates to electric unsymmetrically conductive systems, particularly to dry-plate rectifiers, which comprise between two electrodes of good electric conductivity a succession of semi-conductive layers with different conductivity characters.

It is the object of the present invention to improve the performance of electric unsymmetrically conductive systems of the type above specified.

To this end I propose that an unsymmetrically conductive system according to the invention comprises upon an electrode (base electrode) with good electric conductivity first an intrinsic semi-conductor, then a p-type semi-conductor (or an n-type semi-conductor), further an n-type semi-conductor (or a p-type semi-conductor) and finally again a semi-conductor with intrinsic conductivity, which is covered by the second electrode of good conductivity. Thus two successions of layers are contemplated: (1) electrode, intrinsic semi-conductor, n-type semi-conductor, p-type semi-conductor, intrinsic semi-conductor, electrode, or (2) electrode, intrinsic semi-conductor, p-type semi-conductor, n-type semi-conductor, intrinsic semi-conductor, electrode, both systems differing only in respect of the direction of easy current flow. The properties of the mentioned semi-conductors are well established in the art; but it may be added that the term "intrinsic semi-conductor" is used herein to denote a semi-conductor which is neutral in respect of its conductivity character, or wherein excess and defect centres are present simultaneously so that their effects cancel each other.

The arrangement according to the invention is based on the discovery that not only at the boundary between a metal and a semi-conductor a barrier layer is formed producing an unidirectional conductivity, but that such a barrier layer can be set up also at the boundary between an n-type semi-conductor and a p-type semi-conductor, and also on the further discovery that the formation of undesired barrier layers between the p-type semi-conductor or the n-type semi-conductor on the one hand and the electrode of good conductivity on the other hand can be avoided, if between the said n-type semi-conductor and its electrode and also between the said p-type semi-conductor and its electrode a semi-conductive layer with intrinsic conductive character is interposed. In this way it is possible to make use of the barrier layer formed between the n-type semi-conductor and the p-type semi-conductor undisturbed by any other barrier layer which might interfere with the rectifying effect produced by the said barrier layer between the p-type and the n-type semi-conductors.

Best results are obtained if the density of the free electricity carriers, i. e. numbers of the electrons and/or positive holes, which take part in the current conduction in the n-type semi-conductor and in the p-type semi-conductor, is smaller than $10^{18}$ cm.$^{-3}$, and if the electric conductivity of the semi-conductors with intrinsic conductivity is greater than $10^{-4}$ ohm$^{-1}$ cm.$^{-1}$.

In order that the invention may be clearly understood it will now be described in more detail with reference to the accompanying drawings, wherein: Figure 1 is a dry plate rectifier comprising a general arrangement according to the invention, and Figure 2 comprises a specific arrangement of layers forming another embodiment of the invention; and Figure 3 is a dry plate rectifier comprising another general arrangement according to the invention.

The asymmetrically conductive system according to Figure 1 comprises an electrode 11 with good electric conductivity, a layer 12 constituted by an intrinsic semi-conductor, a layer 13 formed by a p-type semi-conductor, a layer 14 consisting of an n-type semi-conductor, a layer 15 constituted by an intrinsic semi-conductor, and finally an electorde 16 with good electric conductivity. As a result of this arrangement there will be no blocking barriers at the boundaries 17, 18, 19, and 20, so that the barrier layer formed at the boundary 21 between the n-type semi-conductor 14 and the p-type semi-conductor 13 can be utilised to the full, i. e. undisturbed by other barriers which would affect adversely the rectifying effect of the barrier layer 21.

Figure 2:
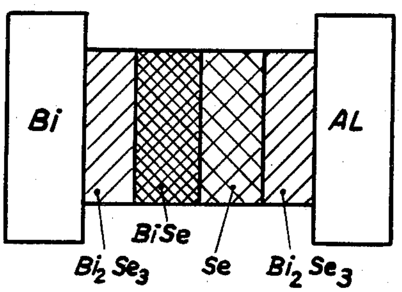
Figure 3:
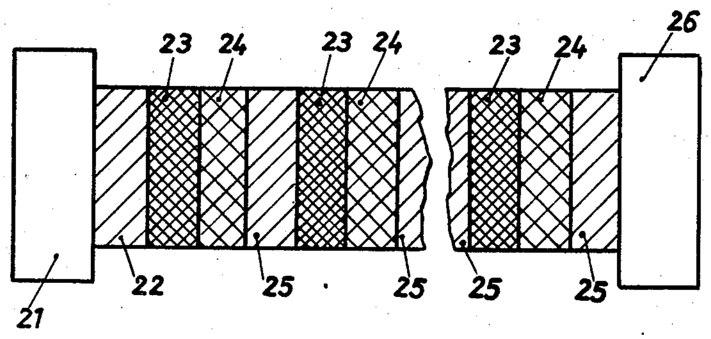

Figure 2 indicates that the base electrode 11 may consist for instance of aluminum, that the first semi-conductive layer with intrinsic conductivity character is formed by bismuth (III) selenide ($Bi_2Se_3$), that the p-type semi-conductor is formed by selenium, that the following n-type semi-conductor is constituted by bismuth (II) selenide (BiSe), that the second intrinsic semi-conductor consists again of bismuth (III) selenide ($Bi_2Se_3$) and that finally the second electrode of good conductivity is formed by bismuth.

Alternatively, the semi-conductive layers 12 and 15 of intrinsic conductivity could be formed by lead peroxide ($PbO_2$), the p-type semi-conductor 13 could be made of cuprous oxide, and the n-type semi-conductor 14 could be constituted by zinc oxide.

The electrodes may consist of any material of good electric conductivity such as a metal or the metal-like allotropic modification of a non-metal and other non-metals of good electric conductivity such as carbon.

The above described arrangements are able to block back voltages e. g. up to 30 to 40 volts, whilst the resistance in the direction of easy current flow is not greater than with conventional dry-plate rectifiers.

In order to keep low the resistance in the direction of easy current flow, it is advisable to make the layers of the semi-conductors with intrinsic conducting character as thin as possible, $10^{-4}$ cm. at the highest, and their specific conductivity as high as possible. It has been found that a sufficient layer thickness is 5 times $10^{-5}$ cm. and a convenient value for the lower limit of the specific conductivity is $10^{-4}$ ohm$^{-1}$ cm.$^{-1}$. The conductivity of the n-type and p-type semi-conductors, however, ought not to exceed a certain value in order to avoid a reduction of the blocking capacity. Pronounced rectifying effects have been observed at the boundary between n-type semi-conductor and p-type semi-conductor, if the number of the free electricity carriers was less than $10^{18}$ cm.$^{-3}$. For obtaining the full effect of the blocking capacity, it has been found that it is sufficient if the n-type and p-type semi-conductive layers have a thickness between $10^{-5}$ cm. and $10^{-2}$ cm., preferably of about $10^{-3}$ cm. It follows, that it does not serve any useful purpose if thicker layers are used, as the resistance in the direction of easy current flow would be increased hereby.

The described arrangement makes it also possible to pile up upon a base electrode a number of the stated successions of layers and to multiply thus the blocking capacity of such a system.

Figure 3 indicates an electric asymmetrically conductive system comprising an arrangement of a plurality of successive groups of semi-conductive layers, one electrode of good conductivity followed by a layer of an intrinsic semi-conductor and a second electrode of good conductivity. Upon an electrode 21 with good electric conductivity is piled up: a layer 22 constituted by an intrinsic semi-conductor, a plurality of groups of semi-conductive layers, each of said groups consisting of a pair of non-intrinsic semi-conductive layers 23 and 24, said layers 23 are formed by a p-type semi-conductor and said layers 24 by an n-type semi-conductor, and of an intrinsic semi-conductive layer 25, and finally a second electrode 26 of good electric conductivity.

It will be understood that this invention is susceptible to modification in order to adapt it to different usages and conditions, and, accordingly, it is desired to comprehend such modifications within this invention as may fall within the scope of the appended claims.

What is claimed is:

1. A dry plate rectifier comprising in consecutive arrangement forming contact with one another a first electrode of good conductivity, a first intrinsic semi-conductor, a pair of non-intrinsic semi-conductive layers, one of said non-intrinsic semi-conductive layers being an n-type semi-conductor, and the other a p-type semi-conductor, a second intrinsic semi-conductor, and a second electrode of good conductivity, said first electrode consisting of aluminum; said first and second intrinsic semi-conductors being of bismuth (III)-selenide ($Bi_2Se_3$); said p-type semi-conductor being arranged in contact with said bismuth (III)-selenide semi-conductor and consisting of selenium; said n-type semi-conductor consisting of bismuth (II)-selenide (BiSe); and said second electrode being of bismuth.

2. A dry plate rectifier comprising in consecutive arrangement forming contact with one another a first electrode of good conductivity, a first intrinsic semi-conductor, a plurality of groups of semi-conductive layers, each of said groups comprising a pair of non-intrinsic semi-conductive layers, and a layer of an intrinsic-semi-conductor, one of said non-intrinsic layers being an n-type semi-conductor, and the other a p-type semi-conductor, and a second electrode of good conductivity following a layer of an intrinsic semi-conductor of said plurality of groups of semi-conductive layers, said first electrode consisting of aluminum; said intrinsic semi-conductors being of bismuth (III)-selenide ($Bi_2Se_3$); said p-type semi conductive layers consisting of selenium; (said n-type semi-conductive layers consisting of bismuth (II)-selenide (BiSe); and said second electrode being of bismuth).

3. A dry plate rectifier comprising in consecutive arrangement forming contact with one another a first electrode of good conductivity, a first intrinsic semi-conductor, a plurality of groups of semi-conductive layers, each of said groups comprising a pair of non-intrinsic semi-conductive layers, and a layer of an intrinsic semi-conductor, one of said non-intrinsic layers being a n-type semi-conductor, and the other a p-type semi-conductor, and a second electrode of good conductivity following a layer of an intrinsic semi-conductor of said plurality of groups of semi-conductive layers; said first electrode consisting of aluminum; said intrinsic semi-conductors being of bismuth (III)-selenide ($Bi_2Se_3$); said p-type semi-conductive layers consisting of selenium; (said n-type semi-conductive layers consisting of bismuth (II)-selenide (BiSe); and said second electrode being of bismuth).

4. A dry plate rectifier comprising in consecutive arrangement forming contact with one another a first electrode of good conductivity, a first intrinsic semi-conductor, a pair of non-intrinsic semi-conductive layers, one of said non-intrinsic semi-conductive layers being an n-type semi-conductor, and the other a p-type semi-conductor, and a second electrode of good conductivity; said first electrode consisting of aluminum; said first intrinsic semi-conductor being of bismuth (III)-selenide ($Bi_2Se_3$); said p-type semiconductive layer consisting of selenium; (said n-type semi-conductive layer being of zinc-oxide (ZnO); said second intrinsic semi-conductor consisting of lead peroxide ($PbO_2$)); and said second electrode being of bismuth.

5. A dry plate rectifier comprising in consecutive arrangement forming contact with one another a first electrode of good conductivity, a first intrinsic semi-conductor, a pair of non-intrinsic semi-conductive layers, one of said non-intrinsic semi-conductive layers being an n-type semi-conductor, and the other a p-type semi-conductor, a second intrinsic semi-conductor, and a second electrode of good conductivity; said first electrode consisting of aluminum, and said second electrode being of bismuth, said p-type semi-conductor being of a semi-conductive material selected from the group consisting of selenium and cuprous oxide, and said n-type semi-conductor being of a semi-conductive material selected from the group consisting of bismuth (II) selenide and zinc oxide.

6. A dry plate rectifier as described in claim 5, wherein the first and second intrinsic semi-conductors consist of lead peroxide ($PbO_2$); said p-type semi-conductor is of cuprous oxide ($Cu_2O$); and said n-type semi-conductor of zinc oxide (ZnO).

References Cited in the file of this patent

UNITED STATES PATENTS 2,569,347 Shockley -------------- Sept. 25, 1951